United States Patent [19]

Thompson

[11] 4,349,797
[45] Sep. 14, 1982

[54] PHASE-COMPENSATED INTEGRATED CIRCUIT

[75] Inventor: Roger S. Thompson, Reigate, England

[73] Assignee: U.S. Philips Corporation, New York, N.Y.

[21] Appl. No.: 146,972

[22] Filed: May 5, 1980

[30] Foreign Application Priority Data

May 10, 1979 [GB] United Kingdom ............... 7916196
Apr. 3, 1980 [GB] United Kingdom ............... 8011440

[51] Int. Cl.$^3$ ............................................. H01L 27/04
[52] U.S. Cl. .................................... 333/215; 357/14; 357/48; 357/51
[58] Field of Search ............... 333/215, 139; 307/491, 307/511, 262, 303, 320; 328/162, 165; 357/51, 48, 14

[56] References Cited

U.S. PATENT DOCUMENTS

| 3,465,213 | 9/1969 | Hugle | 357/51 |
| 3,465,427 | 9/1969 | Barson et al. | 357/51 |
| 3,585,539 | 6/1971 | Rao | 333/215 |
| 3,597,639 | 8/1971 | Harwood | 307/262 |
| 3,748,499 | 7/1973 | Schaffner | 307/511 |
| 3,997,856 | 12/1976 | Canning et al. | 333/215 |
| 4,100,565 | 7/1978 | Khajezadeh et al. | 357/51 |
| 4,258,311 | 3/1981 | Tokuda et al. | 357/51 |

OTHER PUBLICATIONS

Moulding, "Fully Integrated Selectivity at High Frequency Using Gyrators", IEEE Trans. on Broadcast Telev. Receivers, vol. BTR-19, No. 3, Aug. 1973, pp. 176–180.

Primary Examiner—William D. Larkins
Attorney, Agent, or Firm—Thomas A. Briody; Robert T. Mayer; Steven R. Biren

[57] ABSTRACT

Compensation for an effect produced by variations in the base-widths of integrated circuit transistors occurring from batch to batch is obtained by including in each integrated circuit a resistor the resistance of which has an inverse relationship to the transistor base widths and generating a phase shift in the signal path through the transistors, which phase shift depends on the value of the resistance in such manner that a relative phase advance is obtained with increasing values of the base widths. A control signal which depends on the value of a "base-under-emitter" resistor is produced at the output of a control signal generator circuit and is applied to an n-type island in which a "shallow-p" resistor is formed, thereby controlling the reverse bias of the island-resistor junction and hence the capacitance between the resistor and ground. The resistor and associated capacitance constitute a phase-advance network in a gyrator circuit including transistors the base widths of which are arranged to have an inverse relationship to the value of the base-under-emitter resistor by forming the transistors and the base-under-emitter resistor during the same doping steps. The value of the control signal is also arranged to depend on the doping level of the island by including a further resistor in the generator circuit, the value of which correllates with this doping level, thereby compensating for the effects which variations in this doping level would otherwise have on the phase compensation.

8 Claims, 5 Drawing Figures

PHASE-COMPENSATED INTEGRATED CIRCUIT

BACKGROUND OF THE INVENTION

The invention relates to an integrated circuit comprising a transistor, a phase-shifting arrangement which produces a phase shift which is controllable by applying a control signal to a control input thereof, which arrangement is included in a signal path which extends through said transistor, and a control signal generator circuit the output of which is coupled to said control input, said control signal generator circuit including a circuit element comprising doped zones which correspond to the collector, base and emitter zones of the transistor respectively, said element being included in the control signal generator circuit in such manner that the value of the output signal of said generator circuit will depend on the value of an electrical property of said element.

One circuit of this type is known from U.S. Pat. No. 3,597,639. In this known circuit the said circuit element is a diode-connected second transistor, the commoned collector and base of which are connected to a constant-potential point via a variable resistor, and the emitter of which is connected to the emitter of a third transistor included in the phase-shifting arrangement. The function of the series combination of the variable resistor and the second transistor is to control the current flowing through the third transistor in accordance with the setting of the variable resistor, this current determining the phase shift produced by the phase-shifting arrangement. The function of the second transistor is to provide temperature tracking and biasing stabilization.

It is known that the transition frequency $f_T$ of a transistor is related to the width of the base region of the transistor; the smaller the width the higher is the value of $f_T$. When a signal is transmitted through a signal path which extends through the transistor the signal will be subjected to a phase lag in the transistor due to the finite value of the transistor transition frequency. If the frequency of the signal is far below the transition frequency this phase lag will normally be negligible. However, if the frequency of the signal is approaching the transition frequency this will not be the case, and the phase lag produced may have to be taken into account in the design of the circuit including the transistor. For example, if the transistor forms part of a gyrator circuit arrangement one port of which is loaded by a capacitance so that the other port is inductive, this other port being connected to a capacitance to form a parallel or series resonant circuit, the quality factor Q of the resonant circuit will be enhanced if the phase lag produced by the transistor in signals passing through it is significant unless this phase lag is compensated for in some way. In such a case, if the resonant circuit is to have the quality factor required either its basic parameters must be chosen to give this quality factor and phase compensation must be provided, or its basic parameters must be chosen to give a quality factor which is just that amount lower than that which is required which will result in the required quality factor being obtained after its enhancement due to the phase lag.

Current manufacturing techniques for integrated circuits are such that the widths of the base regions, and hence the transition frequencies, of transistors included in the circuits may vary by a considerable amount from batch to batch. Therefore, if the aforementioned resonant circuit where the inductive element is formed by a capacitively-loaded gyrator is constructed as an integrated circuit, the phase lags occurring in the various transistors of the gyrator will be largely unpredictable, with the result that the quality factor of the resonant circuit will also be largely unpredictable if the resonant frequency of the circuit is such that these phase lags are significant. This is true even if purely fixed, i.e. base-width-independent, phase compensation is incorporated in the circuit. If the quality factor required has to be met with only a narrow allowable tolerance this may result in a large number of rejects occurring during mass production. It is an object of the invention to provide means whereby this disadvantage may be mitigated.

SUMMARY OF THE INVENTION

The invention provides an integrated circuit comprising a transistor, a phase-shifting arrangement which produces a phase shift which is controllable by applying a control signal to a control input thereof, which arrangement is included in a signal path which extends through said transistor, and a control signal generator circuit the output of which is coupled to said control input, said control signal generator circuit including a circuit element comprising doped zones which correspond to the collector, base and emitter zones of the transistor respectively, said element being included in the control signal generator circuit in such manner that the value of the output signal of said generator circuit will depend on the value of an electrical property of said element, characterized in that said circuit element is a resistor and said electrical property is the resistance of said resistor, said transistor comprising a first region of one conductivity type provided with an electrical contact, a first region of the opposite conductivity type formed in the first region of the one conductivity type and provided with an electrical contact, and a second region of said one conductivity type formed in the first region of the opposite conductivity type and provided with an electrical contact, said resistor comprising a third region of the one conductivity type, a second region of the opposite conductivity type formed in said third region and provided with a pair of electrical contacts which constitute the terminals of said resistor, and a fourth region of the one conductivity type formed in the second region of the opposite conductivity type, the first and third regions of the one conductivity type having been formed during the same doping step, the first and second regions of the opposite conductivity type having been formed during the same doping step, and the second and fourth regions of the one conductivity type having been formed during the same doping step so that the resistance between the contacts of said pair will increase as the base width of said transistor decreases, the coupling from the output of said control signal generator circuit to said control input having such a sense that signals transmitted through said signal path will be subjected to a phase shift in said arrangement which is larger in the phase lead sense or smaller in the phase lag sense as the value of said width and hence the value of said resistor decreases.

It has now been recognized that the resistance of a so-called "base-under-emitter" resistor in an integrated circuit can correlate sufficiently well with the base width of a transistor or transistors also included in the integrated circuit, provided that the transistor(s) and resistor comprise corresponding doped zones formed during the same doping steps, as to enable a control signal the value of which depends on this resistance to be produced which is usable to control the phase shift produced by a phase-shifting arrangement included in a signal path through each transistor in such manner as to compensate substantially completely for the differences in phase shift produced in the signal path due to variations in the base width of each transistor from batch to batch when such integrated circuits are mass-produced, thereby reducing the number of rejects which would otherwise occur due to the phase shifts in the signal paths being outside tolerance limits imposed thereon.

In order to obtain large variations in the resistance of the resistor with variations in the transistor base width(s) it may be arranged that said fourth region extends from a first part of said third region to a second part of said third region via a route which pases between the contacts of said pair.

A particularly simple way of producing the control signal is to include the resistor between the output of a constant current source and a point of fixed potential, and to d.c.-couple a point on the connection between said constant current source and said resistor to the output of said control signal generator circuit.

A particularly simple realization of the phase-shifting arrangement can be obtained if it comprises a resistance-capacitance combination in which the capacitance is constituted by a pn junction which is arranged to be reverse-biased by the output signal of the control signal generator circuit in operation. If one of the doped regions defining the pn junction is less highly doped than the other of the doped regions defining said junction, the level of doping of this one of the doped regions will largely determine the capacitance exhibited by the junction for given values of reverse-bias applied thereto. Because this level of doping may vary from batch to batch when such integrated circuits are mass-produced, such variations may still result in incorrect phase compensation being obtained in the signal path unless steps are taken to compensate for this, resulting in a large number of rejects still occurring. It has been found that such compensation can be obtained, and hence that the number of rejects can be reduced, if the control signal generator circuit includes a resistive element which comprises a further doped region provided with a pair of electrical contacts, which further doped region has the same conductivity type as has said one of the doped regions defining said junction and has been formed during the same doping step as has said one of the doped regions defining said junction, this resistive element being included in the control signal generator circuit in such manner that the output signal of said generator circuit will depend on the resistance value of said resistive element in such manner that said reverse bias will be less as said resistance value is higher.

If the phase-shifting arrangement comprises a resistance-capacitance combination in which the capacitance is constituted by a reverse-biased pn junction in the manner set out hereinbefore, a particularly simple construction for this arrangement can be obtained if the resistance component of this resistance-capacitance combination is constituted by the resistance of a given one of the doped regions defining the junction, this given one of the doped regions then being provided with first and second electrical contacts. A convenient way of including such an arrangement in the signal path through the transistor is to provide said given one of the doped regions with a third electrical contact in such manner that this third contact is electrically equidistant from the first and second contacts, to connect said first and second contacts to the emitter of the said transistor and to the emitter of a further transistor respectively, and to connect said third contact to the output of a current source. Such an arrangement has been found to be particularly convenient and to be capable of giving satisfactory compensation when the first-mentioned transistor forms part of a first voltage-controlled current source circuit the output of which is connected to the input of a second voltage-controlled source circuit the output of which is connected to the input of said first voltage-controlled current source circuit, one of said current source circuits being inverting and the other being noninverting so that the said current source circuits together form a gyrator circuit, a capacitor being connected across a port of said gyrator circuit. As is known, the other port of such a gyrator circuit is inductive and a resonant circuit can be formed by connecting this other port to a further capacitor. Provision in the manner set out hereinbefore of compensation for the phase shift variations occurring in the gyrator portions of such resonant circuits when they are mass-produced can result in an unacceptable level of rejects arising from the quality factors of the various resonant circuits being outside permitted limits being reduced to an acceptable one.

BRIEF DESCRIPTION OF THE DRAWINGS

Embodiments of the invention will now be described, by way of example, with reference to the accompanying diagrammatic drawings in which.

DETAILED DESCRIPTION

Figure 1:
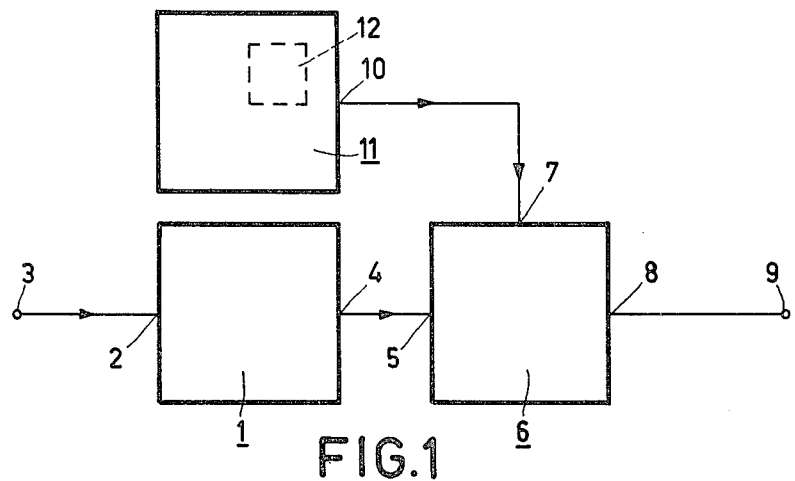
FIG. 1 is a block diagram of an embodiment in accordance with the invention.

In FIG. 1 an integrated circuit comprises a transistor circuit 1, for example, an amplifier circuit, having an input 2 which is coupled a terminal 3 for an input signal. After being processed in the circuit 1 the input signal appears at the output 4 thereof and is applied to the input 5 of a phase-shifting arrangement 6. Arrangement 6 is constructed so that the value of the phase shift produced thereby depends on the value of a d.c. control signal applied to a control input 7 thereof, resulting in the signal applied to the input 5 thereof appearing at its output 8 phase-shifted by an amount which depends on the value of this control signal. The signal appearing at the output 8 is fed to an output terminal 9. The control input 7 is fed from the output 10 of a control signal generator circuit 11.

Generator circuit 11 includes a resistor 12 comprising doped zones of the integrated circuit which correspond to the collector, base and emitter zones respectively of a transistor or transistors included in the circuit and each of which has been formed during the same doping step as has the corresponding zone(s) of the transistor(s). More particularly, each transistor comprises a first region of one conductivity type provided with an electrical contact, a first region of the opposite conductivity type formed in the first region of the one conductivity type and provided with an electrical contact, and a second region of said one conductivity type formed in the first region of the opposite conductivity type and provided with an electrical contact. Moreover, the resistor 12 comprises a third region of the one conductivity type, a second region of the opposite conductivity type formed in said third region and provided with a pair of electrical contacts which constitute the terminals of the resistor, and a fourth region of the one conductivity type formed in the second region of the opposite conductivity type. During manufacture of the resistor and transistor(s) the first and third regions of the one conductivity type are formed during the same doping step, the first and second regions of the opposite conductivity type are formed during the same doping step, and the second and fourth regions of the one conductivity type are formed during the same doping step. The resistor 12 has, in consequence, a resistance which increases as the base region of each said transistor decreases, this resistance being the resistance of the zone of the resistor 12 which corresponds to the base region of each said transistor. Resistor 12 is included in the circuit 11 in such manner that the value of the output signal of the circuit 11 will depend on the resistance of the resistor and thus on the width. The output 10 is coupled to the control input 7 in such a sense that signals traversing the path from input terminal 3 to output terminal 9 will be subjected to a phase shift in arrangement 6 which is greater in the phase lead sense or smaller in the phase lag sense as the value of the base width of each said transistor included in circuit 1, i.e. increases the phase lag produced by the transistor(s). In most cases it will be desirable of course to choose the various circuit parameters in such manner that the overall phase shift (if any) occurring between terminals 3 and 9 will be substantially independent of the base width of each said transistor included in circuit 1.

It will be appreciated that, as an alternative, circuit 1 may be included in the signal path from output 8 to output terminal 9 or, if circuit 1 has the position shown, a further transistor circuit producing base-width-dependent phase shift which is also to be compensated for by the arrangement 11,6 may be present between output 8 and output terminal 9.

Figure 2:
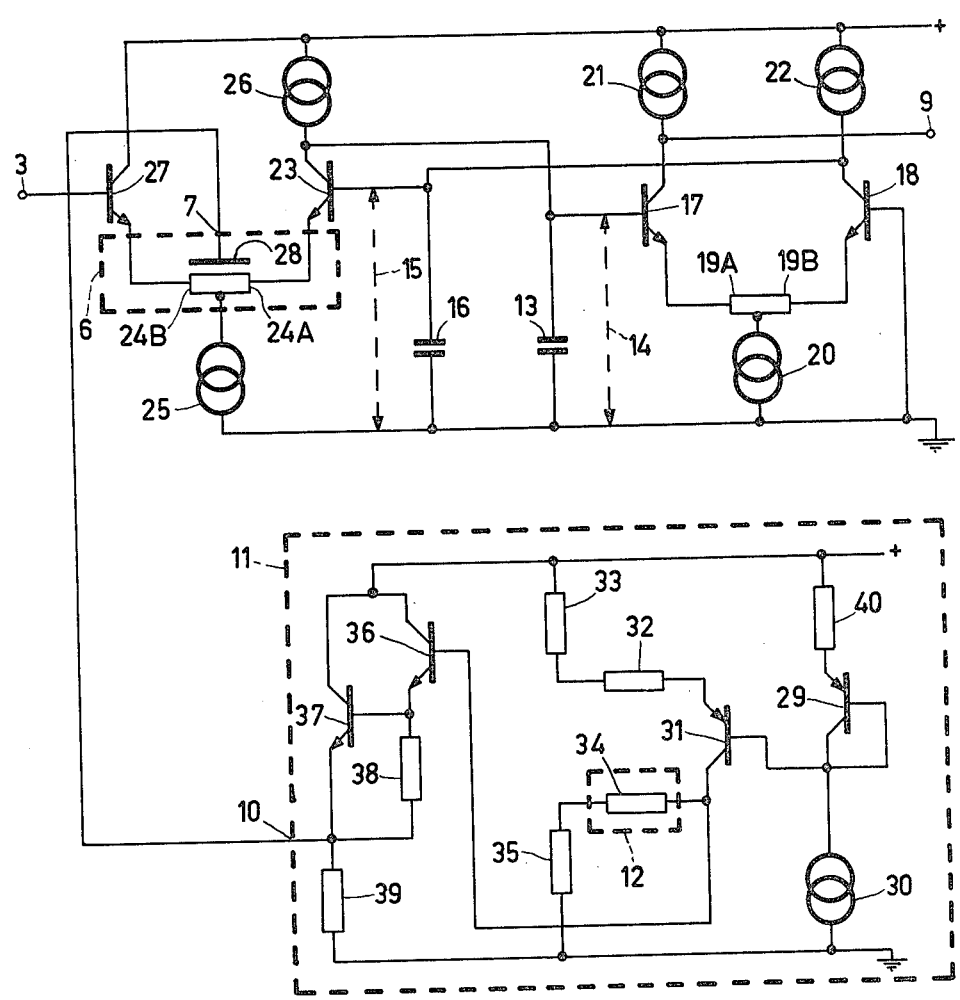
FIG. 2 is a circuit diagram of a possible construction for the embodiment of FIG. 1.

FIG. 2 shows the circuit diagram of a possible construction for the integrated circuit of FIG. 1, equivalent items being given, where possible, the same reference numerals as their counterparts in FIG. 1. The circuit of FIG. 2 comprises a pass filter included between input terminal 3 and output terminal 9, the capacitive element of this pass filter being a capacitor 13, and the inductive element thereof, connected in parallel with capacitor 13, being one port 14 of a gyrator circuit the other port 15 of which is loaded by a capacitor 16. In a conventional manner, the gyrator circuit comprises a noninverting voltage-controlled current source circuit coupling the port 14 to the port 16 and an inverting voltage-controlled current source circuit coupling the port 16 to the port 14. The non-inverting source circuit comprises a pair of transistors 17 and 18, respectively, the emitters of which are connected to ground via resistors 19A and 19B, respectively, of equal value, and a current source 20 which is common to both transistors. The collectors of these transistors are fed from the positive supply line via current sources 21 and 22 respectively. The base of transistor 17 constitutes the input of this source circuit and is connected to capacitor 13, and the common point of the collector of transistor 18 and current source 22 constitutes the output of this source circuit and is connected to capacitor 16. The base of transistor 18 is connected to ground. The inverting source circuit comprises a transistor 23 the emitter of which is connected to ground via a resistor 24A and a current source 25 and the collector of which is connected to the positive supply line via a current source 26. The base of transistor 23 constitutes the input of this source circuit and is connected to capacitor 16, and the common point of the collector of transistor 23 and the current source 26 constitutes the output of this source circuit and is connected to capacitor 13. The input terminal 3 is coupled to the parallel combination of the port 14 and the capacitor 13 via a transistor 27 the collector of which is connected to the positive supply line and the emitter of which is connected to the common point of the resistor 24A and the current source 25 via a resistor 24B of equal value to resistor 24A. The terminal 3 is connected to the base of transistor 27. The parallel combination of the port 14 and the capacitor 13 is coupled to the output terminal 9 via transistor 17, output terminal 9 being connected to the common point of the collector of this transistor and the current source 21. Resistors 24A and 24B are constituted by a center-tapped shallow p-type zone in an n-type island in the semiconductor chip in which the integrated circuit is formed, as will be described in more detail hereinafter, the junction between this zone and island being reverse-biased. The said island is shown diagrammatically at 28. (In fact resistors 19A and 19B are constituted in a similar way.) This structure forms the phase-shifting arrangement 6 of FIG. 1.

The circuit of FIG. 2 also comprises a control signal generator circuit 11 the output 10 of which is connected to the control input 7 of the phase-shifting arrangement 6, i.e. to the aforesaid n-type island. Circuit 11 comprises a transistor 29 the base and collector of which are connected together and to ground via a current source 30 and the emitter of which is connected to the positive supply line via a resistor 40, and a transistor 31 the emitter of which is connected to the positive supply line via the series combination of resistors 32 and 33, the base of which is connected to the common point of current source 30 and the base and collector of transistor 29, and the collector of which is connected to ground via the series combination of resistors 34 and 35. The common point of the collector of transistor 31 and resistor 34 is coupled to the output 10, for impedance matching purposes, via an emitter follower circuit of the Darlington type, this emitter follower circuit comprising transistors 36 and 37 the collectors of which are connected to the positive supply line. The base of transistor 36 is connected to the common point of the collector of transistor 31 and resistor 34, the emitter of transistor 36 is connected to the base of transistor 37 and to the emitter of transistor 37 via a resistor 38, and the emitter of transistor 37 is connected to the output terminal 10 and to ground via a resistor 39. The components 29-33 and 40 form a "current mirror" circuit, a current which is in a specific ratio to the current produced by source 30 being carried by the collector of transistor 31. Thus, if the base current of transistor 36 is neglected, a predetermined constant current is passed through resistors 34 and 35 and hence a d.c. voltage proportional to their values is set up across these resistors and is fed to the output terminal 10 via the emitter-follower circuit 36-39.

Resistor 34 is constructed as a so-called "base under emitter" resistor as will be described in more detail hereinafter and constitutes the resistor 12 of FIG. 1. It comprises doped zones which correspond to the collector, base and emitter zones respectively of the transistors 17, 18, 23 and 27 and which have each been formed during the same doping step as have the corresponding zones of said transistors. As will become clear hereinafter the value of resistor 34 is in consequence related to the base widths of said transistors; the smaller these widths are the larger is the value of resistor 34 and hence the larger is the voltage at the output terminal 10. As will be evident, the potential at terminal 10 governs the reverse-bias between the n-type island 28 and the p-type zone which constitutes the resistors 24A and 24B; the higher the potential at output 10 the higher this reverse-bias will be and hence the lower the capacitance will be between the p-type zone forming resistors 24A and 24B and the n-type island 28. Because this island is effectively at ground potential as far as a.c. signals are concerned and because the emitter of transistor 27 presents a low impedance to the end of resistor 248 connected thereto, the emitter of transistor 23 is in effect connected to ground via the parallel combination of the resistor 24 and the said capacitance. The presence of this parallel combination will therefore, result in signals transmitted by transistor 23 from port 15 to port 14 being advanced in phase relative to the phase which they would otherwise have, the amount of phase advance occurring being greater as the value of the said capacitance becomes longer, i.e. as the base widths of the transistors 17, 18, 23 and 27 become larger. The larger these base widths are the lower the transition frequencies of these transistors will be and hence the greater will be the phase lag created by these transistors. The total phase lag created by the transistors 17, 18 and 23 is the important parameter in the circuit of FIG. 2 (these being the transistors included in the gyrator circuit) and the control signal generator circuit 11 is constructed so that this total lag is substantially exactly compensated for by the phase lead produced in the aforesaid parallel combination. (The purpose of providing resistor 35, which dilutes the effect of changes in the value of resistor 34, is to assist in achieving this end.)

The actual capacitance occurring between the p-type zone constituting the resistance 24A, 24B and the n-type island 28 for specific values of the positive control voltage applied to island 28 will, as is known, depend on the degree of doping of said n-type island (the doping concentration in which is less than that in the said p-type zone). Consequently, if steps were not taken to counteract its effect, variations in the degree of doping of island 28 which are liable to occur from batch to batch when integrated circuits as described are mass-produced would be liable to result in too little or too much compensation for the phase lags produced by the transistors 17, 18 and 23. In order to mitigate this effect the resistor 33 is constructed as an isolated island of the integrated circuit, the doping of this island being carried out during the same doping step as the doping of the island 28. The lower the degree of doping of the island 28 the lower will be the capacitance between this island and the zone constituting resistor 24A, 24B, and conversely. Because the island forming resistor 33 is formed during the same doping step as is the island 28, the lower the degree of doping of the island 28 the lower will be the degree of doping of the island forming resistor 33 and hence the higher will be the value of resistor 33. The higher the value of resistor 33 the lower will be the current carried by the collector of transistor 31 and hence the lower will be the voltage across resistors 34 and 35 and hence at output 10, resulting in increased capacitance between the zone forming resistor 24A and the island 28, thereby compensating for the reduced capacitance due to the doping level of island 28 being too low. Obviously the circuit operates in the converse manner if this doping level is too high. Control signal generator circuit 11 is constructed in such manner that the dependence of the voltage at its output 10 on the value of resistor 33 is such that variations in the doping level of the island 28 are substantially exactly compensated for in this manner. Resistor 32, which dilutes the effect of variation in the value of resistor 33, is provided to assist in achieving this end.

In practice, the base of each of the transistors 17, 18 and 23 may be fed via an individual emitter-follower (not shown) having an emitter load resistor the value of which is in the order of, for example, 10 kohms. Such emitter followers can provide d.c. level shifts where required because of the d.c. couplings used. The values of each of the center-tapped resistors 19 and 24 may be, for example, in the order of 1 kohm. The various ("constant") current sources may be constituted, for example, by high-value resistors or by suitably biased transistors in common-emitter mode (pnp transistors for the sources 21, 22 and 26 and npn transistors for the sources 20 and 30). The values of the resistors 32, 34 and 39 may be for example, in the order of 1 kohm, those of the resistors 35 and 38 in the order of 10 kohm and that of resistor 33 in the order of 100 ohms. The values of resistor 40 and the output current of current source 30 may be chosen so that the collector current of transistor 31 is approximately 500 $\mu$A, giving approximately +5 volts at output 10. The positive supply line may carry 12 volts with respect to ground.

Figure 3:
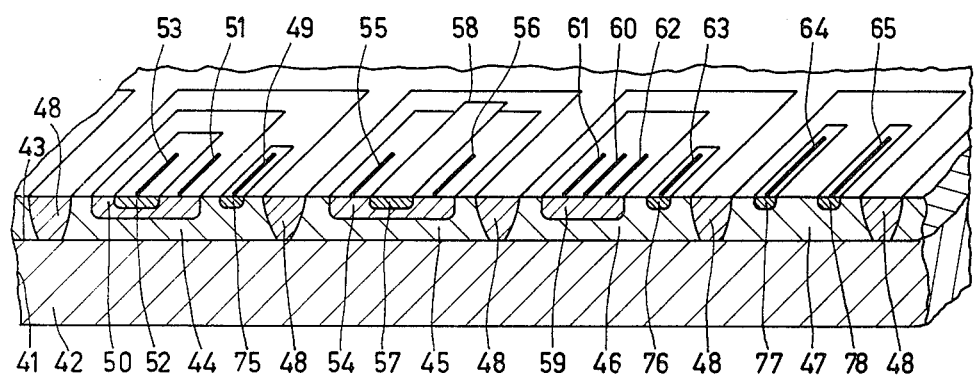
FIG. 3 shows how certain elements of the construction of FIG. 2 are provided in integrated circuit form, and FIGS. 4(A and B) shows possible alternative constructions for one of the blocks of FIG. 1.

FIG. 3 shows how the transistor 17, the resistor 34, the tapped resistor 24, and the resistor 33 of FIG. 2 may be constructed in integrated circuit form. (The transistors 18, 23 and 27 of FIG. 2 may each be constructed in the manner shown for the transistor 17 and the resistors 32 and 35 of FIG. 2 may each be constructed in the manner shown for the resistor 24 but with the tap omitted.) FIG. 3 is a perspective view (not to scale) of the significant components of those parts of the semiconductor chip on which the circuit of FIG. 2 has been fabricated which comprise the transistor 17, the resistor 34, the tapped resistor 24, and the resistor 33, these parts having themselves been sectioned along their axes of symmetry in a plane at right angles to the plane of the chip, so that the surface 41 has become exposed. The chip is in the form of a p-type substrate 42 on which has been formed an n-type epitaxial layer 43. Layer 43 is divided electrically into first, second, third and fourth islands 44, 45, 46 and 47 respectively by a p+ isolation diffusion 48. Island 44 forms the collector of transistor 17 and is provided with an aluminum contact 49, contact 49 contacting island 44 via a shallow n+ diffused zone 75 formed in island 44. The base zone 50 of transistor 17 is formed by a shallow p-type diffusion in island 44 and is provided with an aluminum contact 51. The emitter zone 52 of transistor 17 is formed by a shallow n-type diffusion in base zone 50 and is provided with an aluminum contact 53. Resistor 34 of FIG. 2 is formed in island 45 and comprises a shallow p-type diffused zone 54 provided with aluminum contacts 55 and 56. Overlying the part of the zone 54 which extends between the contacts 55 and 56 is provided a shallow n-type diffused zone 57 each end of which (only end 58 is shown) extends into the n-type material of the island 45, so that a so-called "base under emitter" resistor is formed. Resistor 24A, 24B of FIG. 2 is constituted by a shallow p-type zone 59 formed by diffusion in island 46, this zone being provided with an aluminum contact 60 which constitutes the center tap of the resistor and aluminum contacts 61 and 62 which constitute the two ends of the resistor. Island 46 corresponds to island 28 in FIG. 2 and is provided with an aluminum contact 63, contact 63 contacting island 46 via a shallow n+ diffused zone 76 formed in island 46. Resistor 33 of FIG. 2 is constituted by the material of the island 47, which is provided with aluminum contacts 64 and 65, these contacts contacting island 47 via shallow n+ diffused zones 77 and 78 respectively formed in island 47. During manufacture of the integrated circuit islands 44, 45, 46 and 47 are all formed during the same doping step (the formation of the epitaxial layer 43), zones 50, 54 and 59 are all formed during the same doping step, and zones 52 and 57 are both formed during the same doping step, resulting in the value of the resistor 54, 55, 56, 57, 58 being correlated to the base width (collector to emitter distance) of transistor 44, 49, 50, 51, 52, 53 and the value of resistor 47, 64, 65 being correlated to the doping level in island 46, as required.

It will be evident that it is not essential that each end of zone 57 of FIG. 3 extends into the n-type material of the island 45; one or both ends may terminate within the zone 54. However, in such a case some of the current flowing between the contacts 55 and 56 in operation will flow around rather than under the zone 57, so that the resistance between the contacts 55 and 56 will be less dependent on the spacing between the underside of zone 57 and the adjacent portion of the island 45, and hence on the base width of the transistor 17 (the spacing between the zone 52 and the island 44).

Figure 4A:
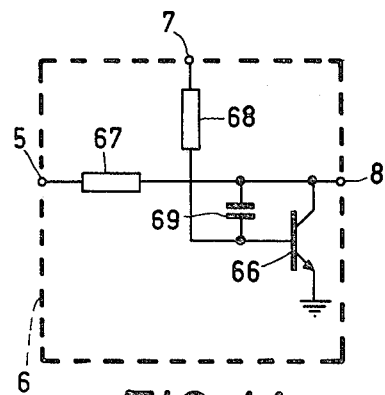

FIG. 4 shows some possible alternative constructions for the phase shifting arrangement 6 of FIG. 1. In FIG. 4A the phase-shifting arrangement 6 comprises a transistor 66 to the collector of which is connected the input terminal 5 via a resistor 67 and to the base of which is connected the control terminal 7 via a resistor 68. The emitter of transistor 66 is connected to ground and its collector is connected to its base via a capacitor 69 and also to the output terminal 8. Terminal 7 is effectively at ground potential as far as the a.c. signal transmitted from terminal 5 to terminal 8 is concerned and the current in capacitor 69 is mirrored by the collector current of transistor 66, so that the end of resistor 67 which is remote from terminal 5 "sees" a parallel capacitance the effective value of which is equal to the value of capacitor 69 increased by a factor proportional to the gain of transistor 66. The gain of transistor 66 increases as the (positive) voltage applied to terminal 7 increases, i.e. the arrangement 6 produces a phase lag the value of which increases with increasing voltage at terminal 7. With this construction for the phase-shifting arrangement 6 the generator circuit 11 of FIG. 1 must therefore be constructed to apply a positive voltage to terminal 7 in such manner that this voltage is less as the base width of at least one transistor in the circuit 1 is larger. The circuit shown in FIG. 2 for generator 11 may therefore be used to supply the terminal 7 of FIG. 4A.

Figure 4B:
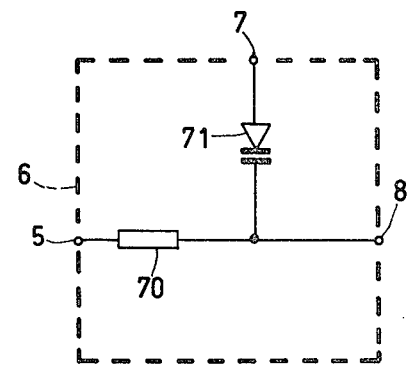

In FIG. 4B the arrangement 6 comprises a resistor 70 connecting the input terminal 5 to the output terminal 8, and a variable capacitance diode 71 between the control terminal 7 and the output terminal 8. The arrangement therefore produces a phase lag at the output terminal 8 relative to the input terminal 5, the value of this lag increasing as the capacitance value of the diode 71 increases. With this construction for the arrangement 6 the generator circuit 11 of FIG. 1 must therefore be constructed to apply a (negative) control voltage to terminal 7 in such manner that the value of this negative voltage is greater as the base width of at least one transistor in the circuit 1 increases.

I claim:

1. An integrated circuit comprising a transistor, a phase-shifting arrangement which produces a phase shift which is controllable by applying a control signal to a control input thereof, which arrangement is included in a signal path which extends through said transistor, and a control signal generator circuit the output of which is coupled to said control input, said control signal generator circuit including a circuit element comprising doped zones which correspond to the collector, base and emitter zones of the transistor, respectively, said element being included in the control signal generator circuit in such manner that the value of the output signal of said generator circuit will be a function of the value of an electrical property of said element, characterized in that said circuit element is a resistor and said electrical property is the resistance of said resistor, said transistor comprising a first region of one conductivity type provided with an electrical contact, a first region of the opposite conductivity type formed in the first region of the one conductivity type and provided with an electrical contact, and a second region of said one conductivity type formed in the first region of the opposite conductivity type and provided with an electrical contact, said resistor comprising a third region of the one conductivity type, a second region of the opposite conductivity type formed in said third region and provided with a pair of electrical contacts which constitute the terminals of said resistor, and a fourth region of the one conductivity type formed in the second region of the opposite conductivity type, the first and third regions of the one conductivity type being formed during the same doping step, the first and second regions of the opposite conductivity type being formed during the same doping step, and the second and fourth regions of the one conductivity type being formed during the same doping step, so that the resistance between the pair of contacts will become larger as the base width of said transistor becomes smaller, the coupling from the output of said control signal generator circuit to said control input having such a sense that signals transmitted through said signal path will be subjected to a phase shift in said arrangement which is larger in the phase lead sense or smaller in the phase lag sense as the value of said width increases and hence as the value of said resistor decreases.

2. A circuit as claimed in claim 1, characterized in that said fourth region extends from a first part of said third region to a second part of said third region and passes between the contacts of said pair.

3. A circuit as claimed in claim 1 or claim 2, characterized in that said resistor is included between the output of a constant current source and a point of fixed potential, a point on the connection between said constant current source and said resistor being d.c.-coupled to the output of said control signal generator circuit.

4. An integrated circuit as claimed in claim 1 or claim 2, characterized in that the phase shifting arrangement comprises a resistance-capacitance combination in which the capacitance comprises a pn junction which is reverse-biased by the output signal of said control signal generator circuit.

5. An integrated circuit as claimed in claim 4, characterized in that one of the doped regions defining said junction is less highly doped than the other of the doped regions defining said junction, and in that the control signal generator circuit includes a resistive element comprising a further doped region provided with a pair of electrical contacts, which further doped region has the same conductivity type as said one of the doped regions defining said junction and is formed during the same doping step as said one of the doped regions defining said junction, said resistive element being included in the control signal generator circuit in such manner that the output signal of said generator circuit will be a function of the resistance value of said resistive element so that said reverse bias will decrease as said resistance value increases.

6. An integrated circuit as claimed in claim 4 characterized that the resistance component of said resistance-capacitance combination comprises the resistance of a selected one of the doped regions defining said junction, which selected one of the doped regions is provided with first and second electrical contacts.

7. An integrated circuit as claimed in claim 6, characterized in that said selected one of the doped regions is provided with a third electrical contact which is electrically equidistant from said first and second contacts, in that said first and second contacts are connected to the emitter of said transistor and to the emitter of a further transistor, respectively, and in that said third contact is connected to the output of a current source.

8. An integrated circuit as claimed in claim 7, characterized in that said transistor forms part of a first voltage-controlled current source circuit the output of which is connected to the input of a second voltage-controlled current source circuit the output of which is connected to the input of said first voltage-controlled current source circuit, one of said current source circuits being inverting and the other being noninverting, so that said current source circuits together form a gyrator circuit, a capacitor being connected across a selected port of said gyrator circuit.

* * * * *